(12) United States Patent
Gorcea et al.

(10) Patent No.: US 6,665,399 B1
(45) Date of Patent: Dec. 16, 2003

(54) HIGH-EFFICIENCY LINE DRIVER

(75) Inventors: Dan Gorcea, Kanata (CA); Carl Anderson, Kanata (CA); Gyula Jakab, Nepean (CA)

(73) Assignee: Nortel Networks Limited, St-Laurent (CA)

( * ) Notice: Subject to any disclaimer, the term of this patent is extended or adjusted under 35 U.S.C. 154(b) by 0 days.

(21) Appl. No.: 09/276,143

(22) Filed: Mar. 25, 1999

(51) Int. Cl.[7] .............................................. H04M 1/00

(52) U.S. Cl. .................................. 379/399.01; 379/398

(58) Field of Search ................................ 379/394, 398, 379/399.01, 402, 403, 404; 375/219, 214, 221, 242

(56) References Cited

U.S. PATENT DOCUMENTS

| | | | | |
|---|---|---|---|---|
| 4,115,658 A | * | 9/1978 | Williams | ............... 379/390.01 |
| 4,748,637 A | * | 5/1988 | Bishop et al. | ............... 375/221 |
| 5,856,758 A | | 1/1999 | Joffe et al. | |
| 6,385,234 B1 | * | 5/2002 | Ashley | ........................ 375/219 |

FOREIGN PATENT DOCUMENTS

| WO | WO 98 38773 | 9/1998 |
|---|---|---|
| WO | WO 98 38774 | 9/1998 |

OTHER PUBLICATIONS

SGS–Thomson Microelectronics, Dual Wide Band Operational Amplifier With High Output Current, TS612, Target Specification, Jun. 1998, pp. 1–11.

* cited by examiner

*Primary Examiner*—Forester W. Iser
*Assistant Examiner*—Jefferey Harold

(57) ABSTRACT

A line driver for connection to a transmission line having a characteristic impedance. The line driver can be arranged in a voltage-mode or a current-mode configuration. In the voltage-mode configuration, the line driver comprises an amplifier, a transformer, a reference resistor and a feedback circuit. The first winding of the transformer has a first end connected to the output of the amplifier and the second winding is connectable to the transmission line. The reference resistor has an end connected to the second end of the first winding at a junction point and the feedback circuit is connected to the input and output of the amplifier and also to the junction point. The reference resistor has a resistance equal to $1/k$ times the characteristic impedance of the transmission line. The feedback circuit is arranged to produce a voltage at the output of the amplifier substantially equal to $-(K-1)$ times the voltage at the junction point, for a predetermined value of K. This results in a synthesized output impedance equal to the characteristic impedance of the transmission line, while losses in the reference resistor are reduced. At the same time, the gain is easily set by the specifying the resistance of a source resistor placed at the input to the amplifier.

20 Claims, 7 Drawing Sheets

HIGH-EFFICIENCY LINE DRIVER

FIELD OF THE INVENTION

The present invention relates generally to line drivers and more particularly to line drivers having a desired output impedance and required to have a high efficiency.

BACKGROUND OF THE INVENTION

A line driver is typically used for sending an electronic signal onto a transmission line type medium, such as a copper twisted pair. To avoid unwanted reflections at the far end of the transmission line, the latter is usually matched, i.e., terminated by a far-end impedance element which presents to the transmission line a resistance equal to the characteristic impedance of the line.

In many situations, the transmission medium is bidirectional, meaning that there is a second transmitter at the far end of the transmission line. In order for the transmission line to be properly matched in the reverse direction, the line must "see" a near-end impedance equal to its own characteristic impedance. The required near-end impedance, known as the output impedance of the line driver, is usually provided by a reference resistor having a resistance equal to the characteristic impedance of the transmission line. In a voltage-mode configuration, the reference resistor is usually placed in series with the line driver, while in a current-mode configuration, one usually opts for a parallel arrangement.

For example, referring to FIG. 1, there is shown a conventional voltage-mode line driver comprising a voltage source/amplifier combination, shown in dotted outline at 102, connected in series with a reference resistor 106 having a resistance $R_e$. The reference resistor 106 is connected to ground via a transformer 108. The transformer 108 generally has two windings with an equal number of turns, one of which is connected to the reference resistor 106 and the other being used for interfacing with a transmission line 110. The transmission line 110 has a characteristic impedance $Z_c$, which is typically in the range of 50 Ω to 600 Ω.

The output resistance of the line driver (denoted $R_{out}$) is defined as the ratio of the voltage $V_0$ appearing across the line driver side of the transformer 108 to the current $I_0$ caused by the voltage $V_0$ when the voltage source/amplifier combination 102 is short-circuited. Upon applying the short circuit, it is seen that the voltage $V_0$ appears in its entirety across the reference resistor 106, from which it follows that $R_{out}$ equals $R_e$. Therefore, in order for the line driver to be matched to the transmission line 110, $R_{out}$ should equal the characteristic impedance $Z_c$, which means that $R_e$ should be set equal to $Z_c$.

Unfortunately, this conventional arrangement results in a wastage of power, as half of the energy output by the voltage source/amplifier combination 102 is lost in the form of heat dissipated in the reference resistor 106. This prevents high-speed modems and other devices that use line drivers from meeting strict power efficiency guidelines. Furthermore, since the amount of circuit card real estate required for a line driver depends on the amount of power that is dissipated, it follows that only a few such drivers can be placed on a circuit card.

A similar scenario occurs in the current-mode dual configuration, now briefly described with reference to FIG. 2. The current-mode line driver comprises a current source/amplifier combination (shown in dotted outline at 202) and placed in parallel with the first winding of a transformer 206.

The transformer 206 has a second winding for interfacing with a transmission line 208 having a characteristic impedance $Z_c$. Proper termination at the line driver end is provided by a reference resistor 210 having a resistance $R_e$ and also placed in parallel with the transformer 206.

The output resistance $P_{out}$ of the line driver in FIG. 2 is defined as the voltage $V_0$ appearing across the line driver side of the transformer 206, divided by the current $I_0$ caused by the voltage $V_0$ with the current source/amplifier combination 202 open-circuited. By applying this open circuit condition, it is seen that the voltage $V_0$ appears in its entirety across the reference resistor 210. Therefore, $R_{out}$ is simply equal to the resistance $R_e$ of the reference resistor 210. To achieve proper termination at the line driver end, $R_{out}$ should be equal to $Z_c$ and thus $R_e$ is usually set equal to $Z_c$.

Because $R_e$ is equal to the characteristic impedance of the transmission line 208, half the energy output by the source/amplifier combination 202 is dissipated in the reference resistor 210. This causes the above-mentioned disadvantages, namely the inability of a conventional line driver to meet power efficiency requirements and the imposition of an undesirably low limit on the number of devices employing line drivers that may be placed on a circuit card.

A known solution is the use of a smaller reference impedance between the output of the line driver and the transmission line and to use a combination of positive and negative feedback around this reference impedance to achieve the desired output impedance. However, one limitation of this method is that the gain of the line driver is low and an additional stage is required at the expense of efficiency and noise performance. Higher gains are achievable but the output impedance is severely affected by tolerances of the components in the positive and negative feedback loops and in the reference impedance.

The above background has shown that there is a need in the industry to provide a line driver which can have the same output resistance as a conventional line driver while reducing the amount of energy or power dissipated in the reference resistor. Furthermore, it would be advantageous to provide a line driver which would also have an independently specifiable gain.

SUMMARY OF THE INVENTION

The invention may be summarized according to a first broad aspect as a line driver equipped with an amplifier, a transformer, a reference resistor and a feedback circuit. The amplifier has an input for connection to a voltage source and having an output. The transformer has a first winding and a second winding, the first winding having a first end connected to the output of the amplifier and having a second end and the second winding being connectable to a transmission line having a characteristic impedance. The reference resistor has an end connected to the second end of the first winding at a junction point. The feedback circuit is connected to the input of the amplifier, to the output of the amplifier and to the junction point.

In accordance with this first broad aspect of the invention, the reference resistor has a resistance equal to $1/K$ times the characteristic impedance of the transmission line and the feedback circuit is arranged to produce a voltage at the output of the amplifier substantially equal to $-(K-1)$ times the voltage at the junction point, for a predetermined value of K.

The resulting output impedance will be equal to K times the reference impedance. At the same time, the voltage across the reference impedance will be reduced by a factor of K, which advantageously reduces the power lost in the reference resistor by a factor of K.

Preferably, the amplifier is an operational amplifier connected in an inverting configuration and the feedback circuit is a resistive network consisting of a first feedback resistor having a first end connected to the output of the amplifier and having a second end connected to the input of the amplifier and also having a second feedback resistor of which a first end connected both to the input of the amplifier and to the second end of the first feedback resistor and of which a second end connected to the junction point. The first feedback resistor preferably has a resistance equal to (K−1) times the resistance of the second feedback resistor.

According to a second broad aspect, the invention may be summarized as a line driver equipped with a transformer, a reference resistor and a feedback circuit. Again, the transformer has a first winding and a second winding, the second winding being connectable to a transmission line having a characteristic impedance. However, in this case, the reference resistor has a first end connected to a first end of the first winding and the feedback circuit has a first port connected both to the first end of the reference resistor and to the first end of the first winding and having a second port connected to the second end of the reference resistor.

The feedback circuit is arranged to draw, through the first port, K−1 times the amount of current flowing through the reference resistor. Hence, the current flowing through the reference resistor will be K times less than the current flowing through the first winding of the transformer, which reduces the losses in the reference resistor while continuing to present a desired output impedance to the transmission line.

Preferably, the feedback circuit is equipped with a first current-to-voltage converter connected to the second port of the feedback circuit, for measuring the current flowing in the reference resistor and a second current-to-voltage converter connected to the first port of the feedback circuit, for measuring the current drawn by the feedback circuit. The feedback also preferably employs a divider circuit and a differential circuit connected to the first and second measuring current-to-voltage converters, for determining the difference between the measured amount of current flowing in the reference resistor and $$\frac{1}{K-1}$$

times the measured amount of current drawn by the feedback circuit. The feedback circuit then generates a compensatory current flowing out the first port, the compensatory current being proportional to the difference so determined.

In accordance with this second broad aspect, the first current-to-voltage converter may be an operational amplifier having an inverting input connected to the second port of the feedback circuit, a non-inverting input connectable to a ground reference and an output and a resistor connected between the input and output of the operational amplifier. The second current-to-voltage converter may be a current transformer connected to the first port of the feedback circuit and having an output.

According to a third broad aspect, the invention may be summarized as a line driver having a transformer, a reference resistor and a feedback circuit. As usual, the transformer has a first winding and a second winding, the second winding being connectable to a transmission line having a characteristic impedance. The feedback circuit has a first port connected to an end of the first winding and also has a second port, a third port and a fourth port. The reference resistor having a first end connected to the second and fourth ports of the feedback circuit and has a second end connected to the third port of the feedback circuit.

In this case, the feedback circuit is arranged to draw, through the fourth port, K times the amount of current flowing through the reference resistor. The current through the reference resistor will be reduced by a factor of K relative to the current flowing through the first winding of the transformer, thereby reducing the energy lost in the reference resistor. Advantageously, the output impedance seen by the transmission line is K times the resistance of the reference resistor.

BRIEF DESCRIPTION OF THE DRAWINGS

These and other aspects and features of the present invention will become apparent to those of ordinary skill in the art upon review of the following description of specific embodiments in conjunction with the accompanying figures, in which:

FIG. 4 shows in greater detail the feedback circuit of

FIG. 3 in accordance with an embodiment of the invention:

DETAILED DESCRIPTION OF THE PREFERRED EMBODIMENTS

I. VOLTAGE-MODE LINE DRIVER

In order to reduce the amount of energy dissipated in the reference resistor while keeping the same output resistance from the point of view of the transmission line, it is proposed to change the position of the reference resistor, to reduce its resistance and to reduce the voltage across the reference resistor relative to the voltage across the transformer on the line driver side.

Figure 1:
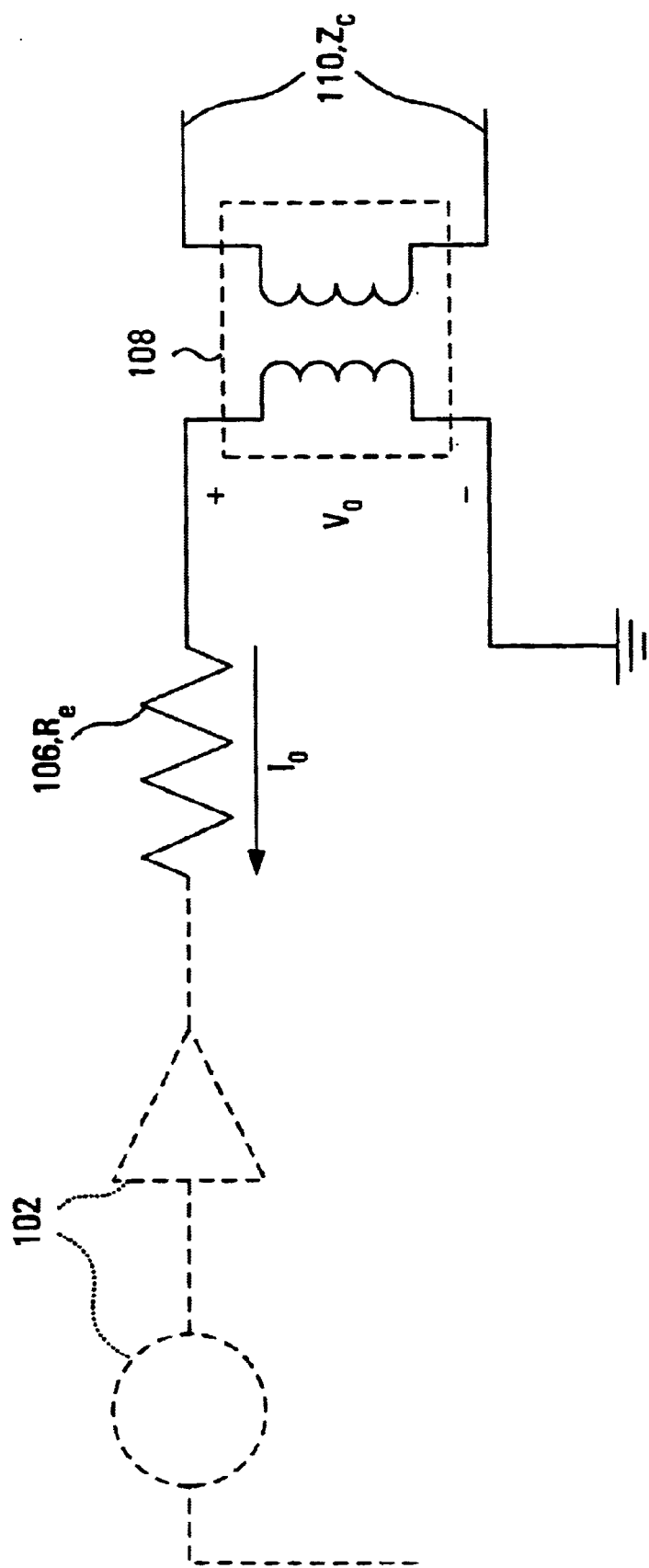
FIG. 1 is a circuit diagram of a conventional voltage-mode line driver.
Figure 2:
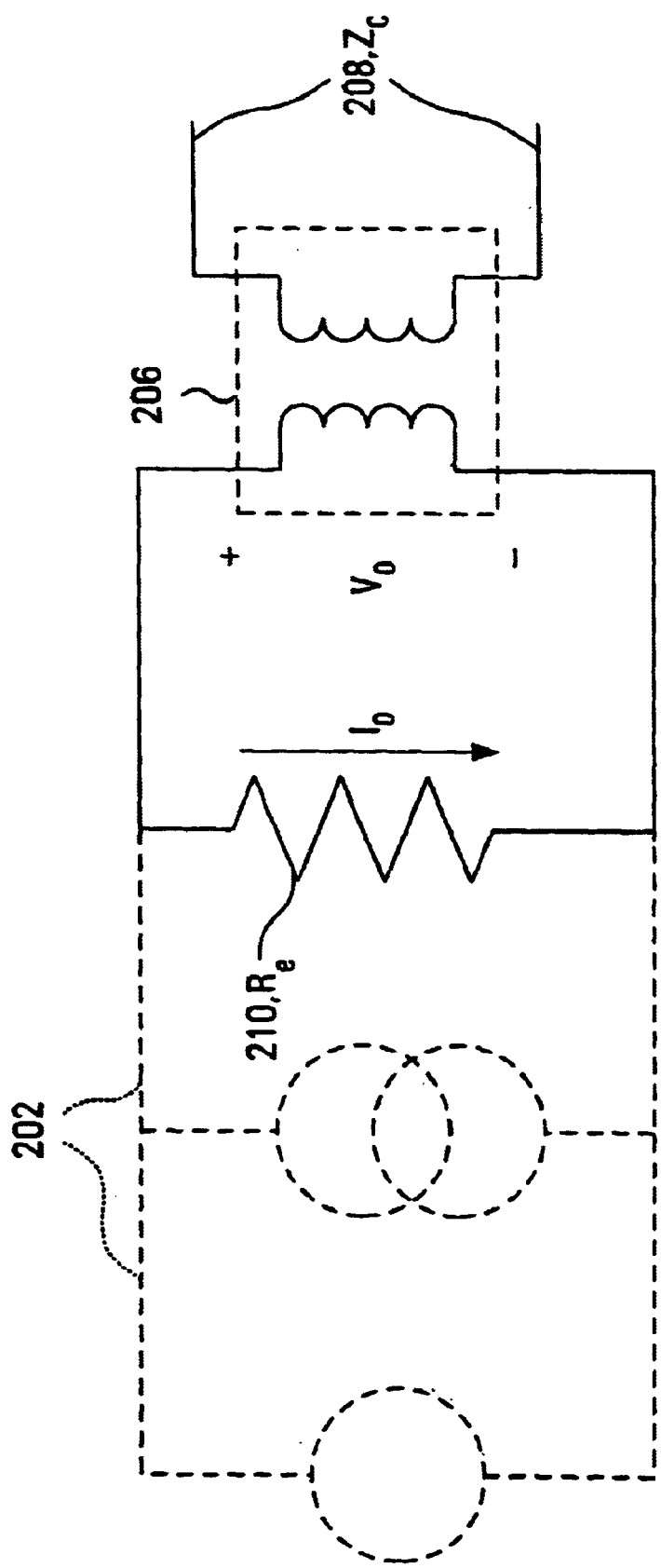
FIG. 2 is a circuit diagram of a conventional current-mode line driver.
Figure 3:
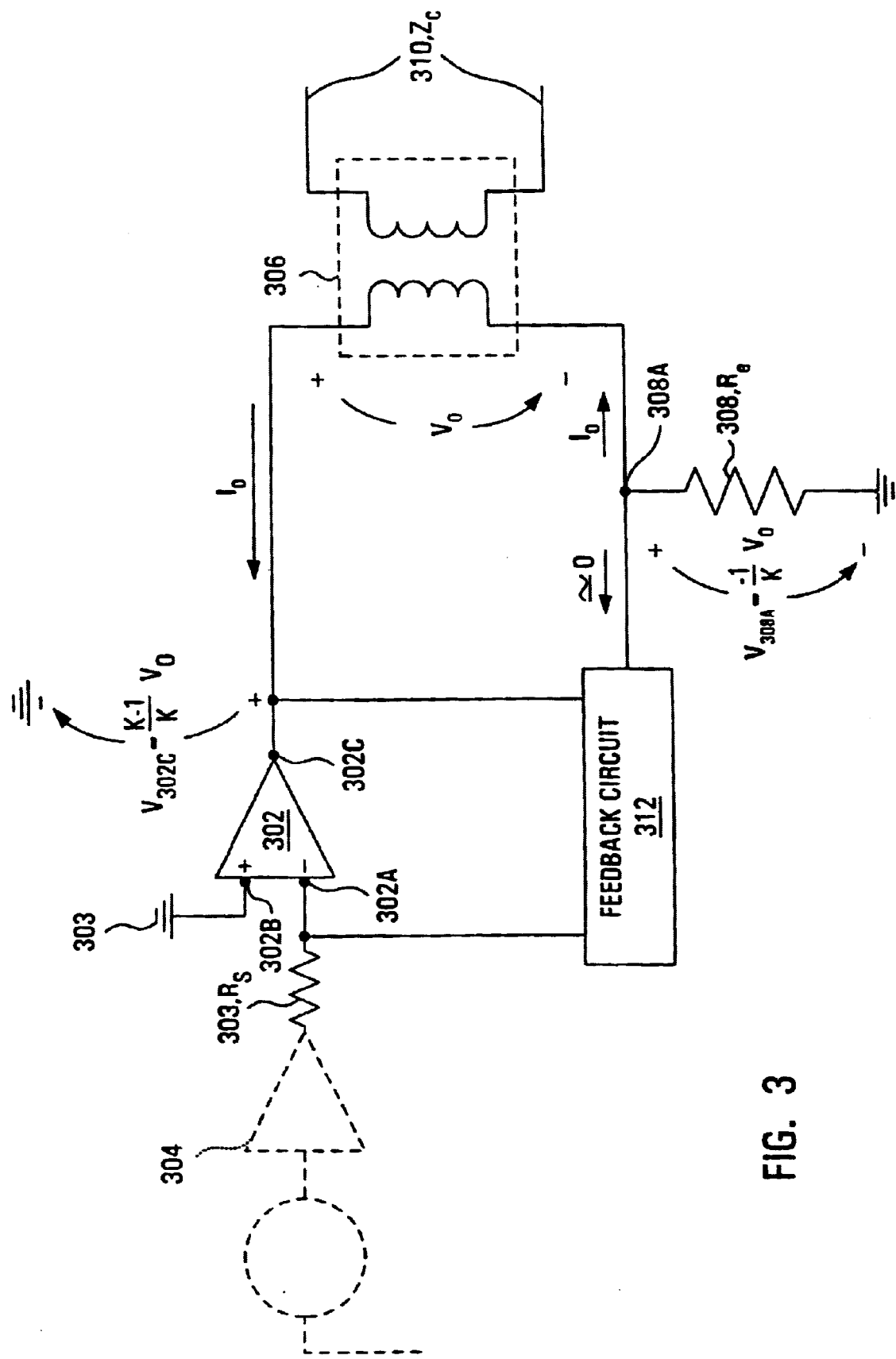
FIG. 3 is a circuit diagram of an inventive voltage-mode line driver, comprising a line driver similar to that of FIG. 1 in addition to a negative feedback circuit.

To this end, FIG. 3 shows a line driver comprising an amplifier 302 driven by a voltage source/amplifier combination (shown in dotted outline at 304) in series with a source resistor 303 having a resistance $R_B$. The amplifier 302 is preferably an operational amplifier (opamp) having an inverting input terminal 302A, a non-inverting input terminal 302B and an output terminal 302C. The non-inverting input terminal 302B of the opamp 302 is connected to a ground reference 303, Assuming the opamp 302 to be ideal, a virtual ground exists at the inverting input terminal 302A.

The inventive voltage-mode line driver of FIG. 3 also 30 comprises a transformer 306, preferably having first and second windings. The first winding has one end connected to the output terminal 302C of the opamp 302 and another end electrically connected to one end of a reference resistor 308 at a junction point 308A. The other end of the reference resistor is connected either to ground or to a virtual ground (e g., the input terminal of an operational amplifier). The second transformer winding is connected across a transmission line 310, which has a characteristic impedance $Z_c$. According to a first preferred embodiment of the invention, the reference resistor 308 has a resistance $$R_e = \frac{Z_c}{K}.$$

The factor $$K = \frac{Z_c}{R_e}$$

is a real number that preferably ranges from 1 to 10, although higher values may be used while remaining within the scope of the invention.

The line driver of FIG. 3 also comprises a feedback circuit 312 connected to the output terminal 302C of the opamp 302, the inverting input terminal 302A of the opamp 302 and the junction point 308A between the transformer 306 and the reference resistor 308. As will be shown in detail hereinafter, for a given voltage $V_0$ across the line driver side of the transformer 306, the feedback circuit 312 is arranged so that the voltage $V_{308A}$ at the junction 308A equals $$-\frac{1}{K}V_0$$

and the voltage $V_{302C}$ at the output terminal 302C of the opamp 302 equals $$\frac{K-1}{K}V_0.$$

The output resistance $R_{out}$ of the circuit in FIG. 3 is calculated as the voltage $V_0$ divided by the current $I_0$ generated as a result of $V_0$. Clearly, if the voltage $V_{308A}$ at the junction point 308A is equal to $$-\frac{1}{K}V_0,$$

and if the feedback circuit 312 generates (or absorbs) a negligible amount of current, then one has:

$$I_0 \simeq \frac{V_0}{KR_e}.$$

Hence:

$$R_{out} = \frac{V_0}{I_0} = \frac{V_0}{\frac{V_0}{KR_e}} = KR_E = K\frac{Z_C}{K} = Z_C,$$

which is the desired output resistance. Thus, the inventive line driver acts as a transimpedance amplifier.

The power $P_{308}$ dissipated in the reference resistor 308 is given by:

$$P_{308} = \frac{V_{308A}^2}{R_E} = \frac{\left(\frac{V_0}{K}\right)^2}{\frac{Z_C}{K}} = \frac{1}{K}\frac{V_0^2}{Z_C},$$

demonstrating that there is K times less power wastage than is the case with conventional voltage-mode line drivers.

Figure 4:
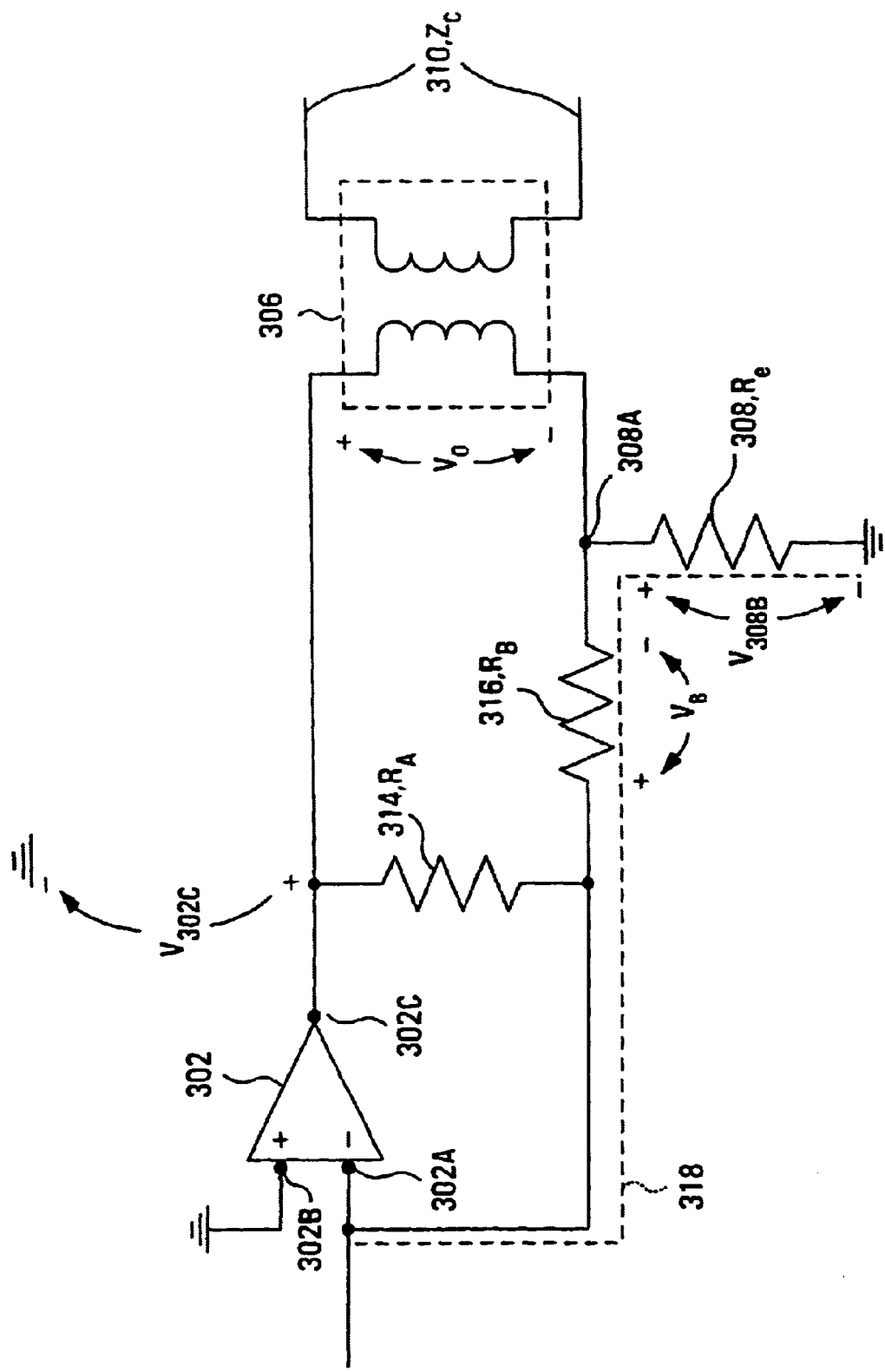

FIG. 4 shows one possible implementation of the feedback circuit 312, comprising a first feedback resistor 314 (with a resistance $R_A$) connected between the inverting input terminal 302A and the output terminal 302C of the opamp 302 and a second feedback resistor 316 (with a resistance $R_B$) connected between the inverting input terminal 302A of the opamp 302 and the junction point 308A between the transformer 306 and the reference resistor 308. In this way, the two feedback resistors 314, 316 each have one end electrically connected to the inverting input terminal 302A of the opamp 302.

Due to the output of the opamp 302 being partially fed back to its inverting input, and by virtue of the voltage division effected by the resistors 314, 316, the voltage $V_{302C}$ at the output terminal 302C will be equal to $$-\frac{R_B}{R_A}$$

times the voltage $V_{308A}$ at the junction point 308A. By selecting $R_B$ to equal (K−1) times $R_A$, it follows that $V_{302C}$ is equal to −(K−1) times $V_{308A}$. As a result, the voltage $V_0$, which is the difference between $V_{302C}$ and $V_{308A}$, is equal to −K times $V_{308A}$ and hence $$V_{308A} = -\frac{1}{K}V_0,$$

as desired.

Furthermore, recalling that a virtual ground exists at the inverting input terminal 302A of the opamp 302, and applying Kirchhoff's voltage law around loop 318, it is seen that the voltage $V_B$ across the second feedback resistor 316 will be equal to the negative of the voltage $V_{308A}$ at the junction point 308A. Therefore, $V_{302C}$ (which is the difference between $V_0$ and $V_B$) is equal to $$\frac{K-1}{K}V_0,$$

as desired.

Those skilled in the art will appreciate that the resistances $R_A$ and $R_B$, which are selected to have the desired ratio of (K−1):1, should also be sufficiently large so that the current flowing through the two feedback resistors 314, 316 is small (e.g., two or more orders of magnitude smaller than the current flowing through the reference resistor 308).

Furthermore, the gain of the line driver is equal to $$-\frac{R_A}{R_B},$$

which can be specified to have any value by appropriately selecting the resistance $R_B$ of the source resistor 303.

II. CURRENT-MODE LINE DRIVER

The voltage-mode line driver of FIG. 4 has a current-mode dual, which is now described with reference to FIG. 5.

In the inventive current-mode configuration, the goal is to reduce the power dissipated in the reference resistor by increasing its resistance, thereby to reduce the amount of current passing through it for the same voltage, while keeping the same output resistance from the point of view of the transmission line.

Figure 5:
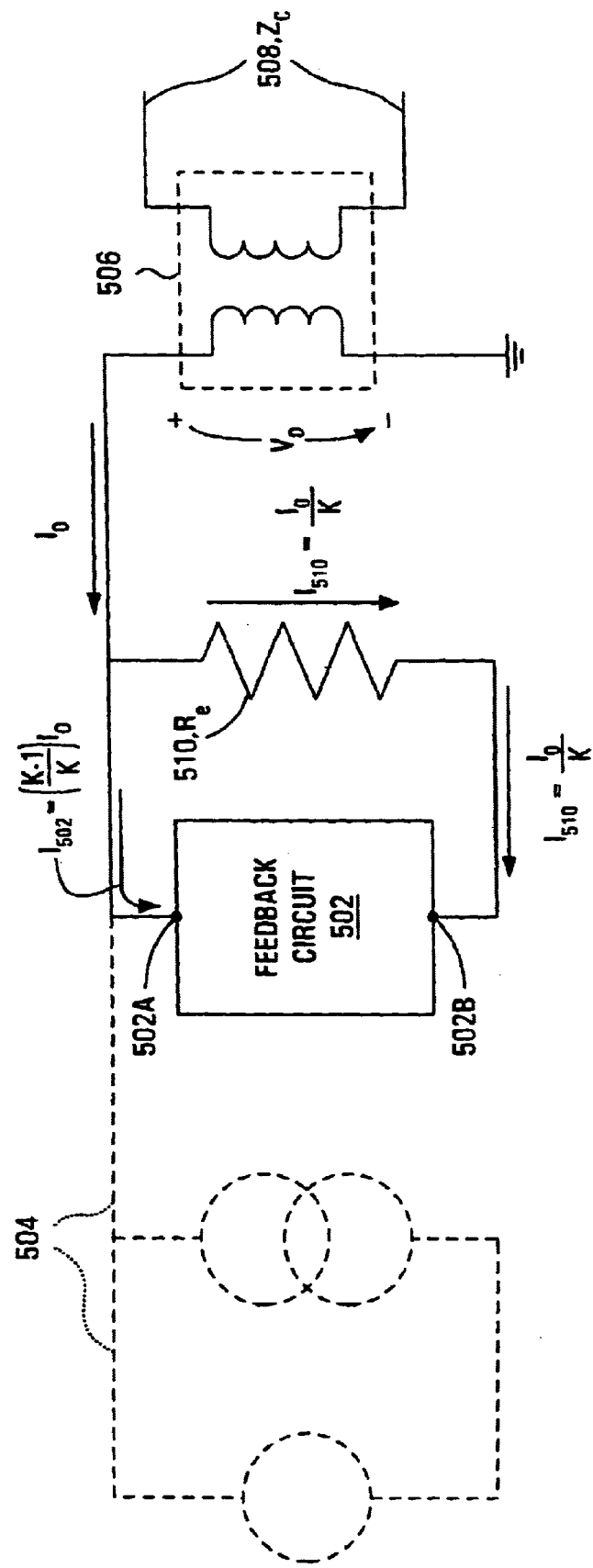
FIG. 5 is a circuit diagram of an inventive current-mode line driver, comprising a line driver similar to that of FIG. 2 in addition to a feedback circuit.

The current-mode line driver of FIG. 5 comprises a feedback circuit 502 having two ports 502A, 502B. Port 502B is connected to one end of a reference resistor 510, while port 502A is connected to the other end of the reference resistor 510, to a current source/amplifier combination (shown in dotted outline at 504), and to one end of a first winding of a transformer 506. The other end of the first transformer winding is grounded. A second transformer winding interfaces with a transmission line 508 having a characteristic impedance $Z_c$. The resistance $R_e$ of the reference resistor 510 is selected to equal K times $Z_c$, where K preferably ranges from 1 to 10 but may be larger if desired.

It is noted that although the first transformer winding is grounded, the reference resistor 510 is not connected to a physical ground. Nevertheless, as will be shown in further detail hereinafter, port 502B still lies at zero potential due to a virtual ground provided by the feedback circuit 502.

In the preferred current-source embodiment, the feedback circuit 502 is designed to draw a current $I_{502}$ which is (K−1) times larger than the current $I_{510}$ passing through the reference resistor 510. Thus, for a given current $I_0$ exiting the line driver side of the transformer, one will have $$I_{510} = \frac{1}{K} I_0 \quad \text{and} \quad I_{502} = \frac{K-1}{K} I_0.$$

Naturally, the feedback circuit 502 should be equipped with a sink (e.g., a physical ground connection) for absorbing the currents entering it via ports 502A and 502B.

The output resistance of the line driver $R_{out}$ is defined as the voltage $V_0$ across the line driver side of the transformer 506 divided by $I_0$, where $I_0$ is the current resulting from $V_0$ with the current source/amplifier combination 504 open-circuited. Since the reference resistor 510 is connected to a virtual ground at port 502B of the feedback circuit 502, the reference resistor 510 will be submitted to $V_0$ in its entirety. Furthermore, since $$I_{510} = \frac{1}{K} I_0,$$

one has:

$$V_0 = I_{510} \cdot R_e = \frac{1}{K} I_0 \cdot R_e = \frac{1}{K} I_0 K Z_c = I_0 Z_c.$$

Therefore, $$R_{out} = \frac{V_0}{I_0} = Z_c,$$

as desired. The power $P_{510}$ dissipated in the reference resistor 510 is given by:

$$P_{510} = \frac{V_0^2}{R_E} = \frac{V_0^2}{KZ_C} = \frac{1}{K} \frac{V_0^2}{Z_C},$$

which, as before, is K times less than what is dissipated in the reference resistor of a conventional line driver.

An embodiment of the feedback circuit 502 with the desired properties is now described with reference to FIG. 6. The feedback circuit 502 comprises a first current-to-voltage converter 602 for measuring the current $I_{510}$ and a second current-to-voltage converter 604 for measuring the current $I_{502}$.

The first current-to-voltage converter 602 is connected to port 502B of the feedback circuit and preferably comprises an opamp 606 with a feedback resistor 608 connected between its output terminal 606C and its inverting input terminal 606A. The non-inverting terminal 606B of the opamp 606 is preferably grounded. When arranged as shown in FIG. 6, the current-to-voltage converter 602 will provide a voltage $V_{606C}$ at the output terminal 606C of the opamp 606 which is proportional to the current $I_{510}$. It is noted that use of the opamp 606 provides the desired virtual ground connection at the inverting terminal 606A, which is electrically connected to port 502B and to the reference resistor 510.

The second current-to-voltage converter 604 consists of a current transformer 608 connected to port 502A of the feedback circuit. The current transformer 608 is of standard design, having a first set of windings 608A through which the current $I_{502}$ flows and a second set of windings 608B coupled to the first set of windings, which produces a voltage $V_{604}$ proportional to the current $I_{502}$. To limit the amount of current coupled by the second set of windings 608B, a resistor 610 may be placed in parallel therewith.

The feedback circuit 502 also comprises a voltage divider circuit 612 connected to the second current-to-voltage converter 604. In the preferred current-mode embodiment of the invention, the voltage divider circuit 612 divides the voltage $V_{604}$ by (K−1), producing a voltage $V_{612}$. Those skilled in the art will be familiar with the design of such a voltage divider circuit.

Finally, the feedback circuit 502 comprises a differential circuit (e.g., an opamp) 614 connected to the output of the first current-to-voltage converter 602 and to the output of the voltage divider circuit 612. The opamp 614 has an output terminal 614C at which is produced a voltage $V_{614}$ that is proportional to the difference between $V_{612}$ and $V_{606C}$. The output terminal 614C of the opamp 614 is connected to port 502A of the feedback circuit via the first set of windings 608B of the current transformer 608.

Figure 6:
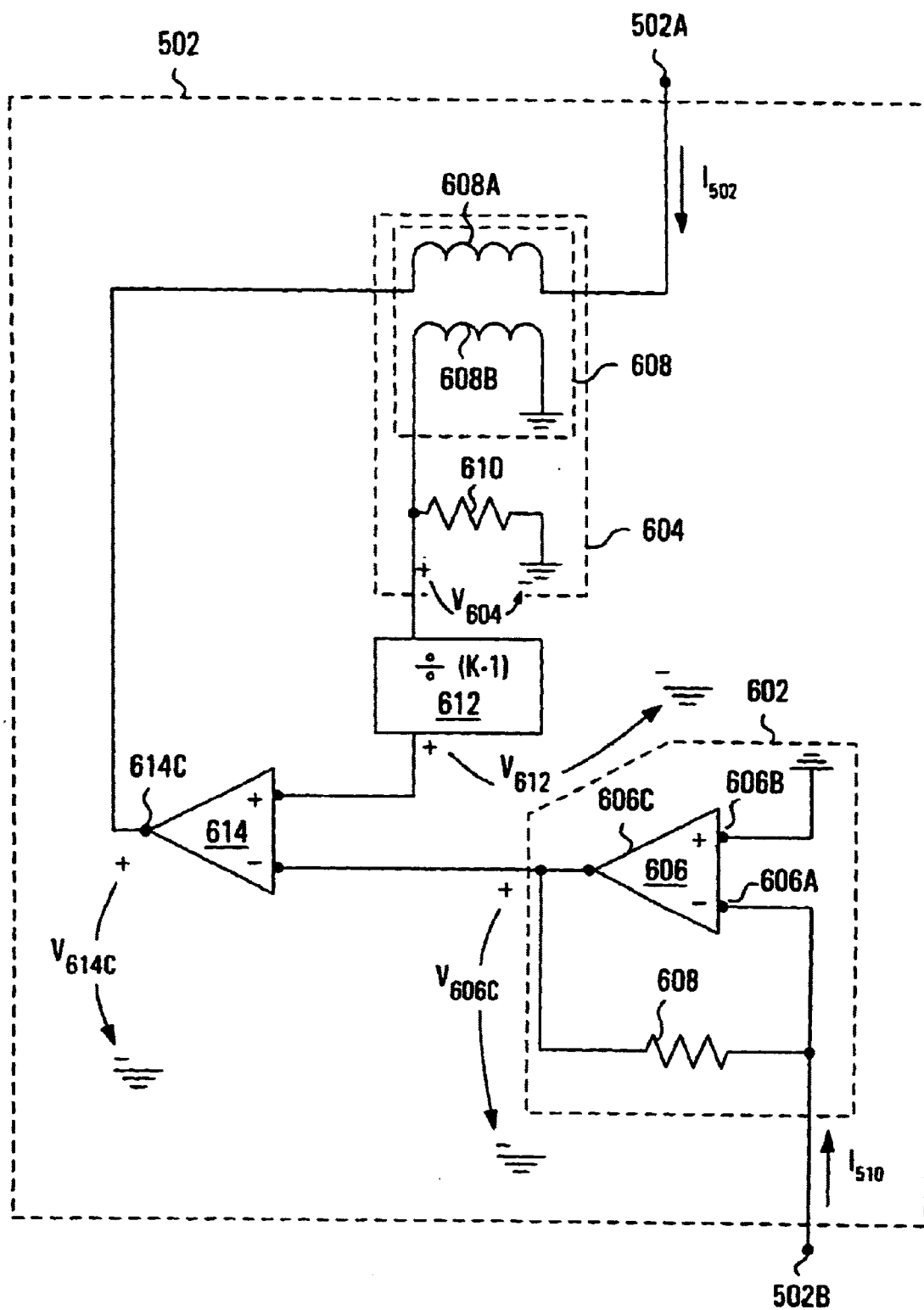
FIG. 6 shows in greater detail the feedback circuit of FIG. 5 in accordance with an embodiment of the invention.

In operation, if the difference between $V_{612}$ and $V_{606C}$ is positive, i.e., if the current $I_{502}$ is too large, then $V_{614C}$ is positive, which causes the opamp 614 a small error current to flow in the direction opposite the direction of the current $I_{502}$ indicated in FIG. 6. The effect is compensatory, as less current is then sensed by the second current-to-voltage converter 604 and more current is sensed by the first current-to-voltage converter 602. This feedback mechanism ensured that error currents are so generated until $V_{612}$ is equal to $V_{606C}$, i.e., until the current sensed by the first current-to-voltage converter 602 is equal to $$\frac{1}{K-1}$$

times the current sensed by the second current-to-voltage converter 604, thus achieving the desired current relationship.

Figure 7:
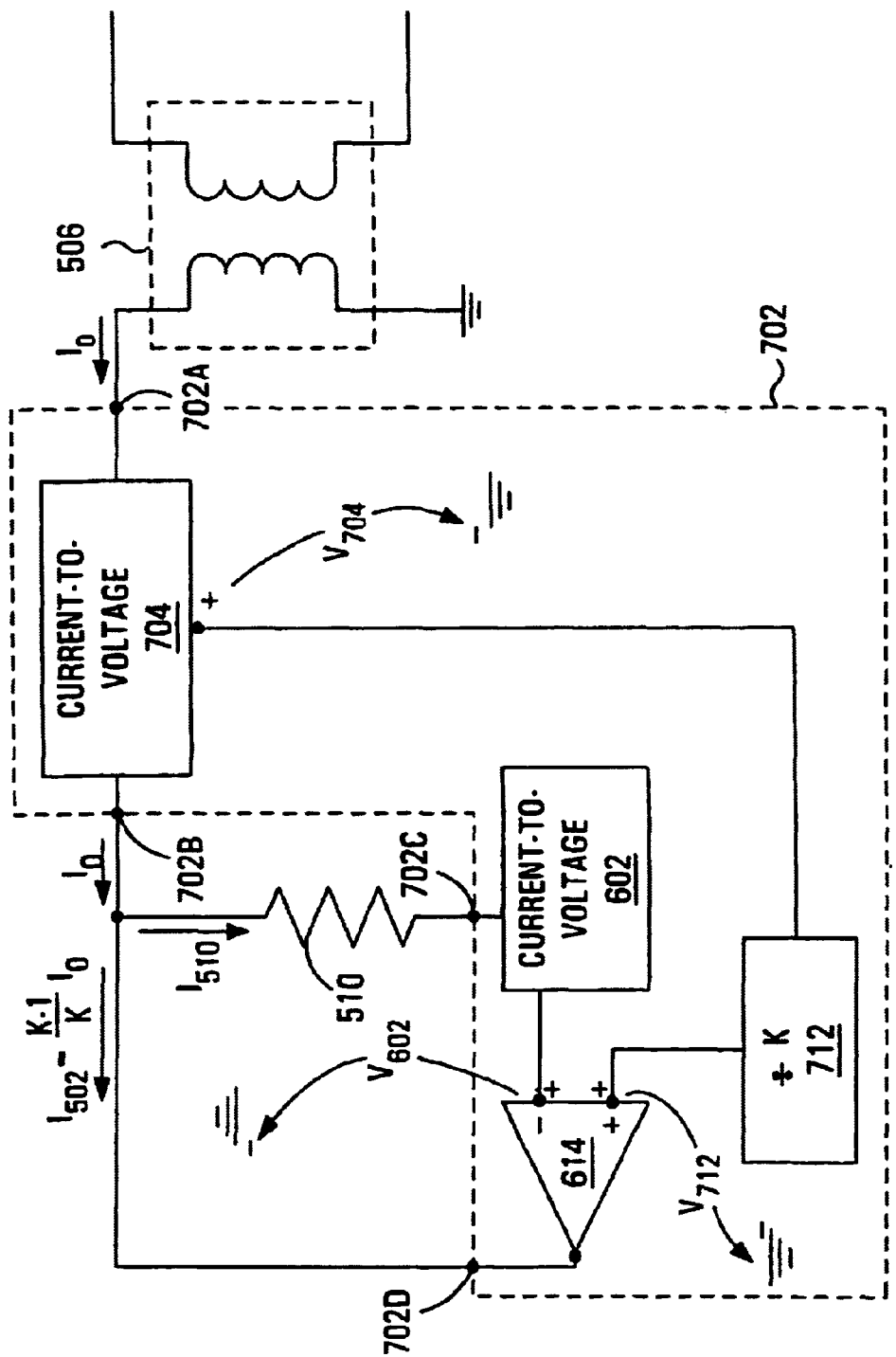
FIG. 7 shows a current-mode line driver in accordance with an alternate embodiment of the present invention.

In an alternative embodiment of the current-mode line driver, shown in FIG. 7, the feedback circuit 702 has four ports, identified as ports 702A,B,C,D. Port 702A is connected to one end of the first winding of the transformer 506, port 702B is connected to a first end of the reference resistor 510, port 702C is connected to a second end of the reference resistor 510 and port 702D is connected to the first end of the resistor and to port 702B of the feedback circuit itself.

The feedback circuit 702 comprises a second current-to-voltage converter 704 which is connected between ports 702A and 702B and which is also connected to a "divide by K" voltage divider 712. This is in contrast to the "divide by (K−1)" voltage divider 612 of FIG. 6. The second current-to-voltage converter 704 may be similar to the second current-to-voltage converter 604 in that it may also consist of a current transformer placed in parallel with a resistor.

The remainder of the feedback circuit 702 is similar to the feedback circuit 502 of FIG. 6, with the first current-to-voltage converter 602 being connected to the second end of the reference resistor 510 (at port 702C) and the opamp 614 having inputs connected to the voltage divider circuit 712 and to the second current-to-voltage converter 602 and having an output connected to the first end of the reference resistor 510 (via port 702D).

Operation of the feedback circuit in FIG. 7 is virtually identical to that of FIG. 6. The first current-to-voltage converter 602 produces a voltage $V_{602}$ which is proportional to the current $I_{510}$ through the reference resistor 510, while the second current-to-voltage converter 704 produces a voltage $V_{704}$ proportional to the current $I_0$ through the first winding of the transformer 506. The "divide by K" voltage divider 712 produces a voltage $V_{712}$ which is proportional to $1/K$ times the current $I_0$ through the first winding of the transformer 506 and the opamp 614 generates an error current proportional to the difference between the voltages $V_{602}$ and $V_{712}$.

Regardless of whether the implementation of FIG. 6 or FIG. 7 is chosen, the current $I_{510}$ drawn by the reference resistor 510 will be $1/K$ times the current $I_0$ exiting the line driver side of the transformer. However, depending on the value of K, it may be more practical to implement the voltage divider circuit as a "divide by K" circuit (at 712 in FIG. 7) rather than a "divide by (K−1)" circuit (at 612 in FIG. 6).

While the preferred embodiment of the present invention has been described and illustrated, it will be apparent to persons skilled in the art that numerous modifications and variations are possible. The scope of the invention, therefore, is only to be limited by the claims appended hereto.

We claim:

1. A line driver, comprising:
    an amplifier having an input for connection to a voltage source and having an output;
    a transformer having a first winding and a second winding, the first winding having a first end connected to the output of the amplifier and having a second end, the second winding being connectable to a transmission line having a characteristic impedance;
    a reference resistor having an end connected to the second end of the first winding at a junction point; and
    a feedback circuit connected to the input of the amplifier, to the output of the amplifier and to the junction point;
    wherein the reference resistor has a resistance equal to $1/K$ times the characteristic impedance of the transmission line and wherein the feedback circuit is arranged to produce a voltage at the output of the amplifier substantially equal to $-(K-1)$ times the voltage at the junction point, for a predetermined value of K.

2. A line driver as claimed in claim 1, wherein the amplifier is an operational amplifier connected in an inverting configuration.

3. A line driver as claimed in claim 1, wherein the feedback circuit comprises:
    a first feedback resistor having a first end connected to the output of the amplifier and having a second end connected to the input of the amplifier; and
    a second feedback resistor having a first end connected both to the input of the amplifier and to the second end of the first feedback resistor and having a second end connected to the junction point;
    wherein the first feedback resistor has a resistance equal to $(K-1)$ times the resistance of the second feedback resistor.

4. A line driver as claimed in claim 3, further comprising a source resistor connected to the input of the amplifier, whereby the line driver produces a gain equal to the negative of the ratio of the resistance of the first feedback resistor to the resistance of the source resistor.

5. A line driver as claimed in claim 1, wherein the transformer is a 1:1 transformer and wherein the first and second windings have an equal number of turns.

6. A line driver as claimed in claim 1, wherein another end of the reference resistor is connected to a ground reference.

7. A line driver, comprising:
    a transformer having a first winding and a second winding, the second winding being connectable to a transmission line having a characteristic impedance;
    a reference resistor having a first end connected to a first end of the first winding;
    a feedback circuit having a first port connected both to the first end of the reference resistor and to the first end of the first winding and having a second port connected to the second end of the reference resistor;
    wherein the feedback circuit is arranged to draw, through the first port, K−1 times the amount of current flowing through the reference resistor.

8. A line driver as claimed in claim 7, wherein the feedback circuit comprises:
    first means connected to the second port of the feedback circuit, for measuring the current flowing in the reference resistor;
    second means connected to the first port of the feedback circuit, for measuring the current drawn by the feedback circuit; and
    means connected to the first and second measuring means, for determining the difference between the measured amount of current flowing in the reference resistor and $$\frac{1}{K-1}$$

times the measured amount of current drawn by the feedback circuit and generating a compensatory current flowing out the first port of the feedback circuit, said compensatory current being proportional to said difference.

9. A line driver as claimed in claim 8, wherein the first measuring means comprises:
    an operational amplifier having an inverting input connected to the second port of the feedback circuit, a non-inverting input connectable to a ground reference and an output; and
    a resistor connected between the input and output of said operational amplifier.

10. A line driver as claimed in claim 8, wherein the second measuring means comprises a current transformer.

11. A line driver as claimed in claim 10, wherein the second measuring means further comprises a resistor placed in parallel with the current transformer.

12. A line driver as claimed in claim 8, wherein the means for determining comprises:
- a divider circuit connected to the second measuring means, for dividing the measured current current drawn by the feedback circuit by (K−1); and
- a differential circuit having a first input connected to the divider circuit, a second input connected to the first measuring means and an output, for producing said compensatory current at the output of the differential circuit as a function of the difference between the voltage at the first and second inputs of the differential circuit.

13. A line driver according to claim 7, wherein the reference resistor has a resistance equal to K times the characteristic impedance of the transmission line.

14. A line driver, comprising:
- a transformer having a first winding and a second winding, the second winding being connectable to a transmission line having a characteristic impedance;
- a feedback circuit having a first port connected to an end of the first winding and having a second port, a third port and a fourth port; and
- a reference resistor having a first end connected to the second and fourth ports of the feedback circuit and having a second end connected to the third port of the feedback circuit;
- wherein the feedback circuit is arranged to draw, through the fourth port, K times the amount of current flowing through the reference resistor.

15. A line driver as claimed in claim 14, wherein the feedback circuit comprises:
- first means connected to the third port of the feedback circuit, for measuring the current flowing in the reference resistor;
- second means connected to the first and second ports of the feedback circuit, for measuring the current flowing in the first winding of the transformer; and
- means connected to the first and second measuring means, for determining the difference between the measured amount of current flowing in the reference resistor and $1/k$ times the measured amount of current flowing in the first winding of the transformer and generating a compensatory current flowing out of the fourth port of the feedback circuit, said compensatory current being proportional to said difference.

16. A line driver as claimed in claim 14, wherein the first measuring means comprises:
- an operational amplifier having an inverting input connected to the second port of the feedback circuit, a non-inverting input connectable to a ground reference and an output; and
- a resistor connected between the input and output of said operational amplifier.

17. A line driver as claimed in claim 14, wherein the second measuring means comprises a current transformer.

18. A line driver as claimed in claim 17, wherein the second measuring means further comprises a resistor placed in parallel with the current transformer.

19. A line driver as claimed in claim 14, wherein the means for determining comprises:
- a divider circuit connected to the second measuring means, for dividing the measured current flowing in the first winding of the transformer by K; and
- a differential circuit having a first input connected to the divider circuit, a second input connected to the first measuring means and an output, for producing said compensatory current at the output of the differential circuit as a function of the difference between the voltage at the first and second inputs of the differential circuit.

20. A line driver according to claim 14, wherein the reference resistor has a resistance equal to K times the characteristic impedance of the transmission line.

* * * * *